United States Patent [19]
Puglisi et al.

[11] Patent Number: 6,165,613
[45] Date of Patent: Dec. 26, 2000

[54] ADHESIVE PASTE FOR SEMICONDUCTORS

[75] Inventors: Christine Puglisi, Mountainside; Gregory Krieger, Somerville, both of N.J.; David Shenfield, Fountain Valley; Richard Kuder, Anaheim, both of Calif.; Chaodong Xiao, East Hanover, N.J.

[73] Assignee: National Starch and Chemical Investment Holding Corporation, Wilmington, Del.

[21] Appl. No.: 09/264,999

[22] Filed: Mar. 9, 1999

[51] Int. Cl.[7] .............................. B32B 15/04; B32B 7/12; C08K 3/10

[52] U.S. Cl. .............................. 428/355 R; 428/355 EP; 524/403

[58] Field of Search ...................... 524/403; 428/355 EP, 428/355 R

[56] References Cited

U.S. PATENT DOCUMENTS

| | | | |
|---|---|---|---|
| 4,933,030 | 6/1990 | Dietz ...................................... | 106/1.14 |
| 5,286,679 | 2/1994 | Farnworth et al. ...................... | 437/209 |
| 5,391,604 | 2/1995 | Dietz et al. .............................. | 524/403 |
| 5,488,082 | 1/1996 | Dietz et al. .............................. | 524/403 |

*Primary Examiner*—Terrel Morris
*Assistant Examiner*—Frederick G. Dean
*Attorney, Agent, or Firm*—Jane E. Gennaro

[57] ABSTRACT

This invention is an adhesive paste that consists essentially of a polymeric resin in particulate form and a carrier for the resin. The polymeric resin is present as particles with a particles size of 50 microns or smaller, is insoluble in the carrier at ambient temperature, and is soluble in the carrier at a temperature above ambient temperature. The carrier either reacts with the resin to form a covalent bond, or vaporizes from the adhesive paste, at a temperature above the temperature at which the resin is soluble in the carrier. The paste contains no inorganic fillers, holds its geometry on application, and fuses to a void-free bond.

11 Claims, No Drawings

ADHESIVE PASTE FOR SEMICONDUCTORS

FIELD OF THE INVENTION

This invention is an adhesive paste for attaching semiconductors to substrates.

BACKGROUND OF THE INVENTION

Semiconductors, or integrated circuit (IC) chips, are mechanically and electrically connected to a substrate, which in turn contains active terminals for connection to the semiconductor and for connection to other electronic devices or an outside power source. The substrate can be rigid, such as a metal leadframe, ceramic substrate, or laminate, or it can be flexible, such as a polyimide flexible circuit.

One method of connecting a semiconductor to its substrate is known as wire-bonding. The IC chip first is adhered to the substrate with a paste or film adhesive. The active terminals on the surface of the chip are then bonded to the active terminals on the surface of the substrate with a fine metal wire, the operation known as wire-bonding. Alternatively, a bare IC chip can be directly attached by wire-bonding to the printed circuit board in an assembly known as chip-on-board.

A critical material in the above assembly process is the adhesive that is used initially to attach the semiconductor to the substrate. If the adhesive is in the form of a paste, the paste typically includes a filler, an adhesive polymeric resin, and a carrier. The filler is selected to give the proper rheological properties to the paste; the polymeric resin, to create a strong bond between the semiconductor and the substrate; and the carrier, to maintain the components in a uniform mixture and allow for easy application.

Typically, the paste is highly loaded with filler. The filler acts to hold the geometry of the paste when it is initially deposited on the substrate and to promote fusion or coalescense of the polymeric resin into a film-like form, optimally without the occurrence of voids. Voids in the fused adhesive will cause the adhesive to fail. The volume of filler needed for these purposes, however, tends to dilute the adhesive properties of the resin.

It would be an advantage, therefore, to provide a die attach adhesive paste that can be used without fillers, that holds its geometry when deposited, and that fuses to a void-free bond.

SUMMARY OF THE INVENTION

This invention is an adhesive paste that consists essentially of a polymeric resin in particulate form and a carrier for the resin. The polymeric resin is present as particles with a particles size of 50 microns or smaller, is insoluble in the carrier at ambient temperature, and is soluble in the carrier at a temperature above ambient temperature. The carrier either reacts with the resin to form a covalent bond, or it vaporizes from the adhesive paste, at a temperature above the temperature at which the resin is soluble in the carrier. The paste contains no inorganic fillers, holds its geometry on application, and fuses to a void-free bond.

DETAILED DESCRIPTION OF THE INVENTION

The adhesive paste of this invention fuses or coalesces to a void-free bond primarily due to two characteristics: the particulate resin will dissolve into the carrier at a temperature above ambient temperature, and the carrier can be eliminated from the paste either by vaporization or through direct chemical reaction with the resin to form a covalent bond. If the particulate resin remains insoluble in the carrier, even at elevated temperature, or if the carrier is not completely eliminated, voids occur when no fillers are used to adjust the rheological properties. Inasmuch as adhesion is superior when not diluted by the presence of fillers, it is an advantage that no fillers need be added to the adhesive paste.

The polymeric resin can be thermoset or thermoplastic. If the manufacturing process for the electronic device in which the adhesive will be used requires that the adhesive be repeatedly softened or solidified, the adhesive preferably will be thermoplastic.

Representative thermoplastic polymers are poly (phenylsulfides), poly(ether sulfones), polyamides, polyimides, polyesters, polycarbonates, polysulfones, polyacetals, polyvinyl halides, polyolefins, halogenated polyolefins, acrylic polymers, vinyl polymers, and thermoplastic epoxy resins.

Representative thermoset polymers are epoxies and phenolic resins.

The polymeric resin is present as particles with a particle size of 50 microns (micron=$1 \times 10^{-6}$ m) or smaller. To prepare the polymers in particulate form, the resin can be comminuted by any of the various techniques known in the art, such as, hammer milling, pin milling, abrasive wheel milling, freeze-drying and cryogenic grinding. Average particle sizes at 50 microns or less result in void-free bondlines.

The carrier for the resin may be either a fugitive carrier (one that vaporizes off) or a reactive carrier (one that reacts with the resin to form a covalent bond). As described in the background section of this specification, the inventive adhesive paste may be used to attach a semiconductor to its substrate before the wire-bonding process. After the paste is deposited and the semiconductor is attached, the resulting assembly is heated to either volatilize off the carrier or react the carrier with the resin, and to fuse the organic polymer resin.

In either case, whether the carrier is fugitive or reactive, the carrier is chosen so that the resin will be insoluble in the carrier at ambient temperature, and soluble at a temperature above ambient temperature, but below the vaporization temperature of the carrier if it is fugitive, and below the temperature at which the carrier reacts with the resin if the carrier is one that will form a covalent bond with the resin.

The polymeric resin will be present in the carrier in as high a concentration as possible that still will permit the resin to dissolve in the carrier at a temperature as just described. As will be understood, this concentration of resin in carrier will vary depending on the solubility parameters of the particular resin and carrier chosen. In general, the adhesive paste will contain polymeric resin present at a concentration of about 20 weight percent or greater, and carrier present in an amount of about 80 weight percent or less, to a total of 100 weight percent.

Practicably, the carrier will be chosen not only for its ability to dissolve the resin, but also so that its vapor pressure is sufficiently low so that it does not rapidly evaporate from the paste at room temperature.

The particular choice of carrier can be tailored for individual manufacturing profiles and is within the expertise of one skilled in the art having the benefit of the knowledge disclosed in this specification. Current commercial practice sets the preferred vaporization (for fugitive carriers) or reaction temperature (for reactive carriers) in the range of 100°–160° C., although this may change as manufacturing practices change. A suitable fugitive carrier with properties within this range is 1,1-bis(3,4-dimethylphenyl)ethane. A suitable reactive carrier is octyl/decyl/tetradecyl glycidyl ether.

The adhesive paste may contain additives in kinds and amounts known and used in the thick film/paste art, such as, adhesion promoters, thermal stabilizers, antioxidants, wetting agents, and tackifiers. These components, however, are such that they do not affect the basic and novel characteristics of the composition, which is that the paste is prepared from resin particles and a carrier, without the necessity for inorganic fillers to provide theological properties.

In practice, the resin particles are admixed with the carrier at ambient temperature to form a paste. The paste is applied at this temperature to the substrate and contacted with or without pressure to the semiconductor. (Alternatively, the paste is applied to the semiconductor and then contacted to the substrate.) The paste is heated to dissolve the polymer particles into the carrier, and then heating is continued to either react the resin with the carrier or to evaporate off the carrier, and to cause the resin particles to fuse. During this process, the concentration of the polymeric resin permits the adhesive paste to hold its geometry. Because there are no fillers to interfere with the fusion of the resin particles, the resultant film is void-free.

As will be understood by those skilled in the art, the viscosity of the paste can be modified for smooth dispensing without dripping or tailing by changing the proportion of the components within the concentration ranges stated.

As described in this specification, the adhesive is useful in one embodiment as an adhesive to adhere an IC chip to a substrate. It can be applied either to the individual semiconductor die or to the substrate, such as, the lead fingers of a leadframe. The adhesive is heated, either by heating the die or the leadframe, and with the contact of the adhesive to the confronting surface, with or without pressure, the adhesive attaches the die to its substrate with a firm bond upon cooling.

The adhesive also can be used in any application for creating a bond between two surfaces, for example, surface mounting electronic components onto a printed circuit board.

Although the essence of the invention is a paste that requires no fillers, with the addition of electrically or thermally conductive fillers, the adhesive can form an electrically or thermally conductive bond between two surfaces. Electrically and thermally conductive fillers, and suitable loadings for the fillers in the adhesive, are known and used in the art.

The adhesive also may be applied directly to the silicon wafer from which the individual semiconductor chips or dies are diced or cut. The adhesive may be applied to the active surface of the wafer containing the circuitry or to the passive surface, depending on the chosen method of fabrication for the semiconductor package. If the adhesive is deposited on the active surface, customarily the deposition will follow the patterning of an insulating/passivating layer on the wafer. Alternately, the adhesive may be deposited on the passive surface of the wafer. The adhesive also may be patterned to leave clear areas between the ultimate individual dies for saw-cutting the dies from the wafer. These clear areas are known as streets, avenues, or saw or scribe lines. The invention can be practiced with the adhesive present or eliminated from the streets, or patterned such that the bond pads on the individual dies are free of adhesive. The patterning is accomplished by any of the methods known and used in the art.

EXAMPLES

The following examples will serve to illustrate the invention, but are not to be considered as limiting.

Example 1

A paste adhesive was prepared from 40 parts by weight of a particulate polyimide resin (prepared from the reaction of sulfide dianhydride and 1,3-bis(aminophenoxy benzene)) with an average particle size of 1 micron; 45 parts by weight 1,1-bis(3,4-dimethylphenyl)ethane as a fugitive liquid; and 15 parts by weight triallyl-1,3,5-triazine-2,4,6-trione as a wetting agent.

The paste was used to attach a silicon die to a metal lead frame substrate. The paste was coated on the lead frame at 6–7 microns thickness and the die contacted with the paste. Heat was applied at 140° C., the temperature at which the resin particles dissolved into the fugitive carrier and the carrier began to evaporate. The assembly was subjected to wire-bonding at 180°–195° C., and encapsulation at 180° C.–200° C., as described in the background section of this specification.

To test for delamination at the adhesive bondline (a sign that the adhesive bondline contained voids), the assembly was subjected to a temperature of 125° C. for 24 hours, followed by 85° C. and 85% relative humidity for 168 hours, followed by a repeated heating to 240° C. and cooling to 20° C. three times. No delamination was found, indicating no or minimum voids in the adhesive bondline.

Example 2

The same polyimide resin as used in Example 1 was mixed at 20 parts by weight into 80 parts by weight of 4-bromo-o-xylene to form a smooth, uniform paste. The polyimide easily went into solution at 100° C. The paste was coated onto a silver plated copper leadframe at about 7 microns thickness, dried at 160° C. for 10 minutes, and then at 270° C. for 1 minute. The fused adhesive was continuous and void free.

Example 3

The same polyimide as used in Example 1 was mixed at 40 parts by weight in 60 parts by weight polyethylene glycol to form a smooth paste. The paste was coated at about 7 microns thickness onto a silver plated copper leadframe and dried at 350° C. The fused adhesive was void free.

Example 4

The same polyimide as used in Example 1 was mixed at 40 parts by weight in 60 parts by weight polyethylene glycol to form a smooth paste. The paste was coated at about 7 microns thickness onto a silver plated copper leadframe and dried at 240° C. The fused adhesive was void free.

Example 5

The same polyimide as used in Example 1 was mixed at 55 parts by weight in 45 parts by weight polyethylene glycol to form a smooth paste. The paste was coated at about 7 microns thickness onto a silver plated copper leadframe and dried at 220° C. for 4 minutes, and then at 350° C. for 1 minute. The fused adhesive was void free.

Example 6

The same polyimide as used in Example 1 was mixed at 50 parts by weight in 50 parts by weight octyl/decyl/ tetradecyl glycidyl ether (available from Shell) to form a smooth paste. The paste was coated onto two silver plated copper leadframes; one sample was dried at 200° C., and the second at 250° C., both for 2 minutes. The fused adhesives were void free.

A third sample of the paste was dispensed into the gap between a leadframe and chip and dried at 250C. for 10 minutes. The fused adhesive was substantially void free.

Example 7

The same polyimide as used in Example 1 was mixed at 50 parts by weight in 50 parts by weight dodecyl/tetradecyl glycidyl ether available from Shell) to form a smooth paste. The paste was coated onto two silver plated copper leadframe; one sample was dried at 200° C., and the second at 250° C., both for 2 minutes. The fused adhesives were void free.

Example 8

The same adhesive paste as prepared in Example 1 was applied to a silver plated copper leadframe at about 7 microns thickness and a glass slide contacted with the adhesive. The assembly was dried at 140° C. for 5 minutes and 270° C. for 4 minutes. The fused adhesive was substantially void free.

Example 9

Polysulfone resin, commercially available from Aldrich, was mixed at 50 parts by weight into 50 parts by weight 1,1-bis(3,4-dimethylphenyl)-ethane to form a smooth, uniform paste. The paste was coated onto a glass slide and heated within a temperature range of 200–240° C. until the resin went into solution. The paste was then dried on a hot plate at 240° C. for 2 minutes. The fused adhesive was continuous and void free.

Example 10

Polystyrene resin, commercially available from Aldrich, was mixed at 60 parts by weight into 40 parts by weight 1,1-bis(3,4-dimethyl-phenyl)ethane to form a smooth, uniform paste. The paste was coated onto a glass slide and heated within a temperature range of 200–240° C. until the resin went into solution. The paste was then dried on a hot plate at 240° C. for 2 minutes. The fused adhesive was continuous and void free.

Example 11
Comparative

The same polyimide resin as used in Example 1 was mixed at 40 parts by weight into 60 parts by weight of water to form a smooth, uniform paste. The polyimide is insoluble in the water, even at elevated temperature. The paste was applied in a coating approximately 8 mils thick to a silver plated copper lead frame, dried on a hot plate at 80° C. for approximately 10 minutes, and then at 250° C. for approximately 10 minutes. The fused adhesive was non-uniform and filled with voids.

Example 12
Comparative

The same polyimide resin as used in Example 1 was mixed at 40 parts by weight into 60 parts by weight of glycerol to form a smooth, uniform paste. The polyimide is insoluble in the glycerol, even at elevated temperature. The paste was applied in a coating approximately 8 mils thick to a silver plated copper lead frame and dried at 250° C. for 10 seconds, at which point voids (bubbles) appeared in the adhesive. The experiment was repeated a second time in which the adhesive was dried at 190° C. for 10 minutes, then at 250° C. for 5 seconds. Voids appeared in the fused adhesive. The experiment was repeated a third time in which the adhesive was dried at 170° C. for 15 minutes, after which the temperature was ramped to 300° C. at a rate of 4 C. per minute. Voids appeared in the fused adhesive.

Example 13
Comparative

The same polyimide as used in Example 1 was mixed at 50 parts by weight with 50 parts by weight of a carrier mixture of 50% water, 50% 1-methyl-2-pyrrolidinone by volume. It was previously determined that the polyimide is insoluble in the water and soluble in the pyrrolidinone at room temperature. The paste was applied in a coating approximately 8 mils thick to a silver plated copper lead frame and dried at 250° C. for 1 minute, by which time numerous voids had appeared in the fused adhesive. The experiment was repeated a second time in which the paste was heated by ramping the temperature from room temperature at a rate of 10° C. per minute. By the time the temperature reached 90° C., the adhesive contained numerous voids.

In the following claims "consist essentially of" means that the adhesive paste may have other components than the particulate polymer resin and carrier, but those other components will not impart any essential significance to the composition nor will they affect the basic and novel characteristics of the adhesive paste.

What is claimed is:

1. An adhesive paste consisting essentially of an organic polymer resin and a carrier for the resin,
   in which the organic polymer resin is present as particles with a particle size of 50 microns or smaller, is insoluble in the carrier at ambient temperature, and is soluble in the carrier at a temperature above ambient temperature;
   and in which the carrier reacts with the resin or vaporizes from the adhesive paste at a temperature above the temperature at which the resin is soluble in the carrier.

2. The adhesive paste according to claim 1 in which the polymer resin is present at a concentration of about 20 weight percent or greater, and the carrier is present in an amount of about 80 weight percent or less, to a total of 100 weight percent.

3. The adhesive paste according to claim 1 in which the carrier is a fugitive carrier and the organic polymer resin is present in the fugitive carrier in as high a concentration as possible that still will permit the polymer resin to dissolve in the carrier at a temperature above ambient temperature and below the vaporization temperature of the fugitive carrier.

4. The adhesive paste according to claim 3 in which the fugitive carrier is 1,1-bis(3,4-dimethylphenyl)ethane.

5. The adhesive paste according to claim 1 in which the carrier is a reactive carrier and the organic polymer resin is present in the reactive carrier in as high a concentration as possible that still will permit the polymer resin to dissolve in the reactive carrier at a temperature above ambient temperature and below the temperature at which the carrier will react and form a covalent bond with the resin.

6. The adhesive paste according to claim 5 in which the reactive carrier is octyl/decyl/tetradecyl glycidyl ether.

7. The adhesive paste according to claim 1 in which the organic polymer resin is a thermoplastic polymer or a thermoset polymer.

8. The adhesive paste according to claim 7 in which the organic polymer resin is a thermoplastic polymer selected from the groups consisting of poly(phenylsulfides), poly (ether sulfones), polyamides, polyimides, polyesters, polycarbonates, polysulfones, polyacetals, polyvinyl halides, polyolefins, halogenated polyolefins, acrylic polymers, vinyl polymers, and thermoplastic epoxy resins.

9. The adhesive paste according to claim 7 in which the organic polymer resin is a thermoset polymer selected from the groups consisting of epoxies and phenolic resins.

10. An electronic device adhered to a substrate with the adhesive of claim 1.

11. A silicon wafer, from which individual semiconductor chips are cut, on which wafer is deposited the adhesive of claim 1.

* * * * *